(12) United States Patent
Tang et al.

(10) Patent No.: US 7,981,730 B2
(45) Date of Patent: Jul. 19, 2011

(54) INTEGRATED CONFORMAL SHIELDING METHOD AND PROCESS USING REDISTRIBUTED CHIP PACKAGING

(75) Inventors: Jinbang Tang, Chandler, AZ (US); Darrel R. Frear, Phoenix, AZ (US); Scott M. Hayes, Chandler, AZ (US); Douglas G. Mitchell, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 437 days.

(21) Appl. No.: 12/169,964

(22) Filed: Jul. 9, 2008

(65) Prior Publication Data

US 2010/0006988 A1    Jan. 14, 2010

(51) Int. Cl.
*H01L 23/552* (2006.01)
*H05K 3/10* (2006.01)

(52) U.S. Cl. ........ 438/124; 257/422; 257/659; 257/660; 257/723; 257/728; 257/E23.114; 438/119; 438/121; 438/122; 438/123; 438/125; 438/126; 438/127; 174/51; 174/520; 174/521; 29/824; 29/841; 29/846

(58) Field of Classification Search ............... 257/422, 257/659, 660, 723, 728, E23.114; 438/119, 438/121–127; 174/51, 520, 521; 29/824, 29/841, 846

See application file for complete search history.

(56) References Cited

U.S. PATENT DOCUMENTS

| | | | | |
|---|---|---|---|---|
| 5,373,627 A | * | 12/1994 | Grebe | .................... 29/841 |
| 5,394,304 A | * | 2/1995 | Jones | ..................... 361/765 |
| 5,467,064 A | | 11/1995 | Gu | |
| 5,639,989 A | * | 6/1997 | Higgins, III | .................. 174/386 |
| 6,289,204 B1 | | 9/2001 | Estes et al. | |
| 6,492,194 B1 | * | 12/2002 | Bureau et al. | ............... 438/106 |
| 6,601,293 B1 | | 8/2003 | Glenn | |
| 6,649,446 B1 | * | 11/2003 | Goetz et al. | ................. 438/110 |
| 6,822,880 B2 | | 11/2004 | Kovacs et al. | |
| 7,013,558 B2 | | 3/2006 | Bachman | |
| 7,145,084 B1 | | 12/2006 | Sarihan et al. | |
| 2001/0013650 A1 | | 8/2001 | Goetz et al. | |
| 2003/0109077 A1 | * | 6/2003 | Kim et al. | ..................... 438/106 |
| 2005/0046001 A1 | | 3/2005 | Warne | |
| 2005/0067676 A1 | | 3/2005 | Mahadevan et al. | |
| 2007/0045795 A1 | | 3/2007 | McBean | |
| 2007/0210427 A1 | | 9/2007 | Lytle et al. | |
| 2008/0265421 A1 | * | 10/2008 | Brunnbauer et al. | ......... 257/758 |

OTHER PUBLICATIONS

R. Warren, Skyworks, Next Generation System-in-Package Solutions for Mobile/Wireless Products, 2006.
Amkor Technology, Embedded Shielding Update, 2006.

(Continued)

*Primary Examiner* — Eugene Lee
*Assistant Examiner* — Peniel M Gumedzoe
(74) *Attorney, Agent, or Firm* — Hamilton & Terrile, LLP; Michael Rocco Cannatti

(57) ABSTRACT

An integrated conformal electromagnetic interference (EMI) and/or electromagnetic radiation shield is formed on a plurality of encapsulated modules by attaching a plurality of modules (30-33) to a process carrier (1) using a double side adhesive tape (2), and then sequentially depositing an insulating layer (15) and a conductive shielding layer (16) before encapsulating the modules with a molding compound (17). After removing the adhesive tape (2) to expose a surface of the encapsulated modules, a multi-layer circuit substrate (100) is formed over the exposed surface, where the circuit substrate includes shielding via structures (101-112) that are aligned with and electrically connected to the conductive shielding layer (16), thereby encircling and shielding the circuit module(s).

17 Claims, 10 Drawing Sheets

OTHER PUBLICATIONS

J. Tang et al., Integrated Shielding Process for Precision high Density Module Packaging, U.S. Appl. No. 11/854,776, filed Sep. 13, 2007.
Freescale Semiconductor, Redistributed Chip Packaging (RCP) Technology, http://www.freescale.com/webapp/sps/site/overview.jsp?code=ASIC_LV3_PACKAGING_RCP&fsrch=1, printed Jul. 3, 2008.
Freescale Semiconductor, Redistributed Chip Package (RCP) Technology, 2005.

* cited by examiner

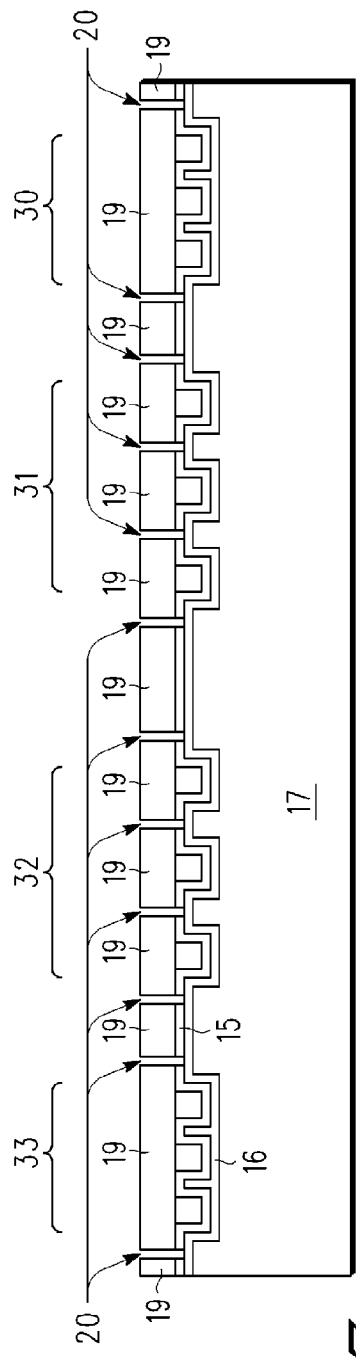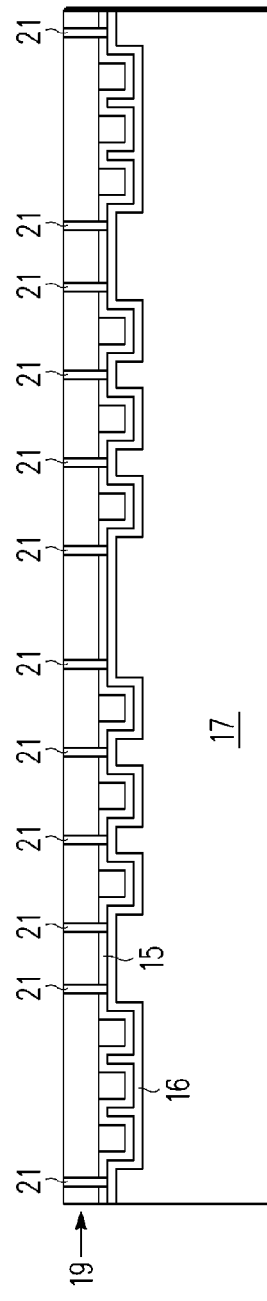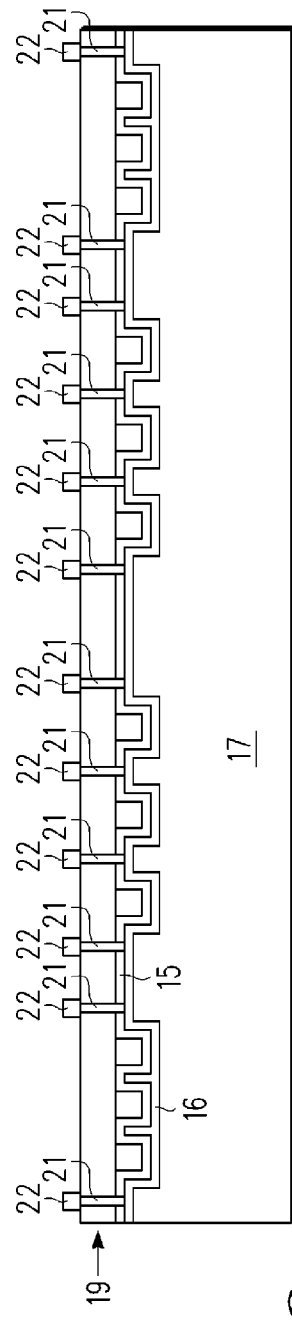

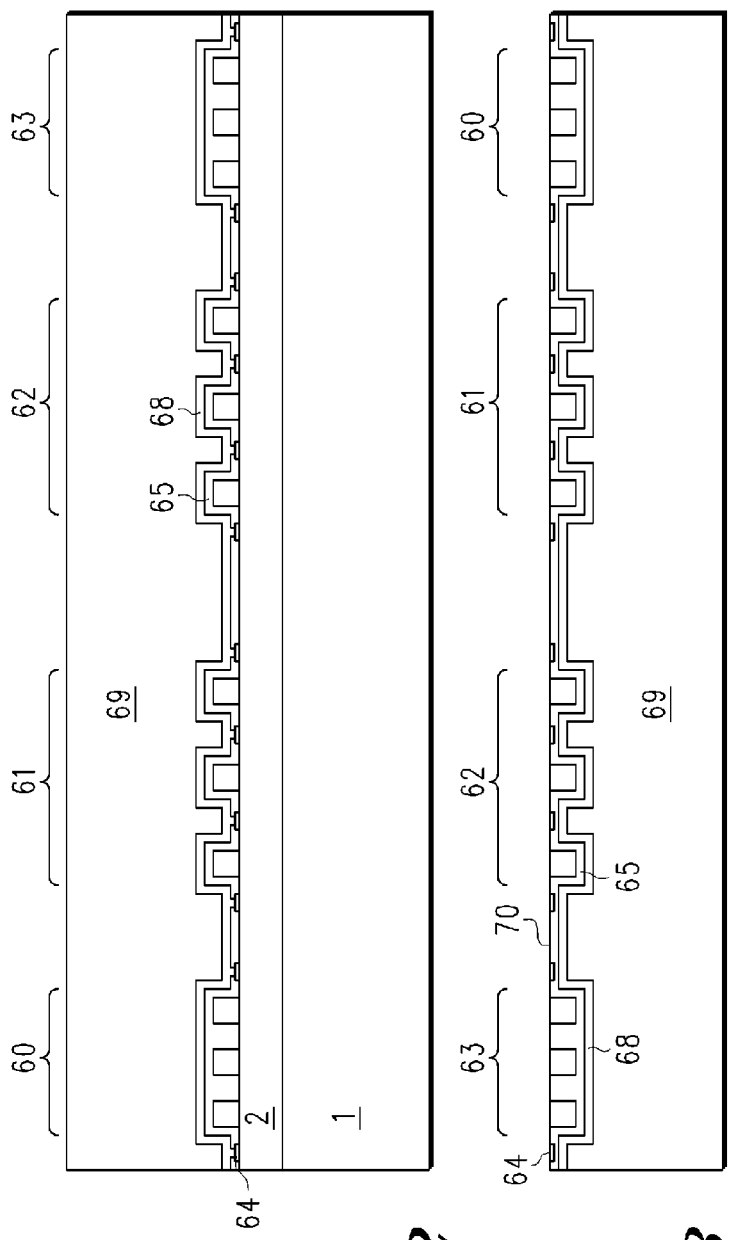
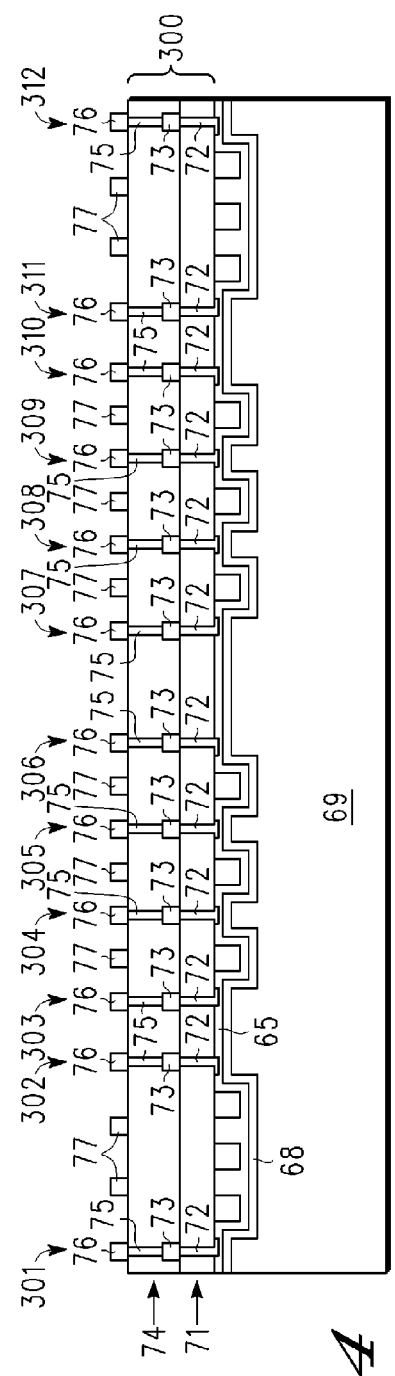
FIG. 22
FIG. 23
FIG. 24

INTEGRATED CONFORMAL SHIELDING METHOD AND PROCESS USING REDISTRIBUTED CHIP PACKAGING

BACKGROUND OF THE INVENTION

1. Field of the Invention

The present invention is directed in general to the field of semiconductor devices. In one aspect, the present invention relates to packaging of semiconductor devices in a planar panel configuration to provide shielding against electromagnetic interference.

2. Description of the Related Art

Semiconductor and other types of electronic devices are often encapsulated wholly or partly in plastic resin to provide environmental protection and facilitate external connection to the devices. Such devices also need to be protected from electromagnetic interference (EMI) which is the undesired electrical signals, or noise, in electronic system circuitry caused by the unintentional coupling of electromagnetic field energy from other circuitry, such as wires, printed circuit board conductors, connector elements, connector pins, cables, and the like. For example, multiple chip modules (MCM) are semiconductor devices having a plurality of discrete microelectronic devices (e.g., a processor unit, memory unit, related logic units, resistors, capacitors, inductors, and the like) that are connected together on a single MCM substrate. Conventional approaches for shielding against EMI have used board or system level EMI shielding techniques, though this does not provide protection against interference caused by modules within the board or system. Other shielding techniques have attempted to protect against radio/electromagnetic interference by using conformal shielding technologies to packaging the individual circuit modules (e.g., MCMs), such as by using wire bond grounding connection techniques, laser-drilled via grounding connection techniques, or double-cutting methods. An example of this approach is with mobile phone designs which seek to push EMI shielding from metal lids on phone boards to the discrete packaged RF module level. However, these techniques require extra substrate space to apply the shielding, or impose an extra space and double saw operation, or otherwise increase the cost and complexity of the packaging process. In addition, these techniques typically require post mold assembly processes to add conformal EMI shielding to the packaged circuit modules, such as by drilling blind vias in the package molding compound which are then filled with a conductive material to form a shielding via in the molding compound. However, there are a number of alignment problems with forming blind vias that can impact device reliability and yield, such as creating electrical shorts to signal pads and/or signal paths or connection failures from mis-alignment.

Accordingly, there exists a need for a packaging scheme that provides improved EMI shielding. There is also a need for an improved process for integrating shielding structures in packaged circuit modules. In addition, there is a need for a reliable and cost effective semiconductor device package that provides reliable EMI shielding with little or no impact on the size of the packaging device. There is also a need for improved packaging processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which:

FIG. 7 illustrates processing subsequent to FIG. 6 after a first dielectric layer of a multilayer substrate is formed on the backside of the encapsulated plurality of chip modules and patterned openings are formed in the first dielectric layer to expose the conductive shielding layer;

FIG. 8 illustrates processing subsequent to FIG. 7 after micro vias are formed in the patterned openings;

FIG. 9 illustrates processing subsequent to FIG. 8 after micro pads are formed in alignment with the micro vias formed on the backside of the encapsulated plurality of chip modules;

FIG. 22 illustrates processing subsequent to FIG. 20 after a conductive shielding layer and molding compound are formed to encapsulate the panel-mounted plurality of chip modules;

FIG. 23 illustrates processing subsequent to FIG. 22 after the removable attachment device and process carrier are removed and the encapsulated plurality of chip modules is turned over;

FIG. 24 illustrates processing subsequent to FIG. 23 after a multilayer substrate is formed with grounding via structures which are electrically connected to the embedded ground plane conductor.

Figure 1:
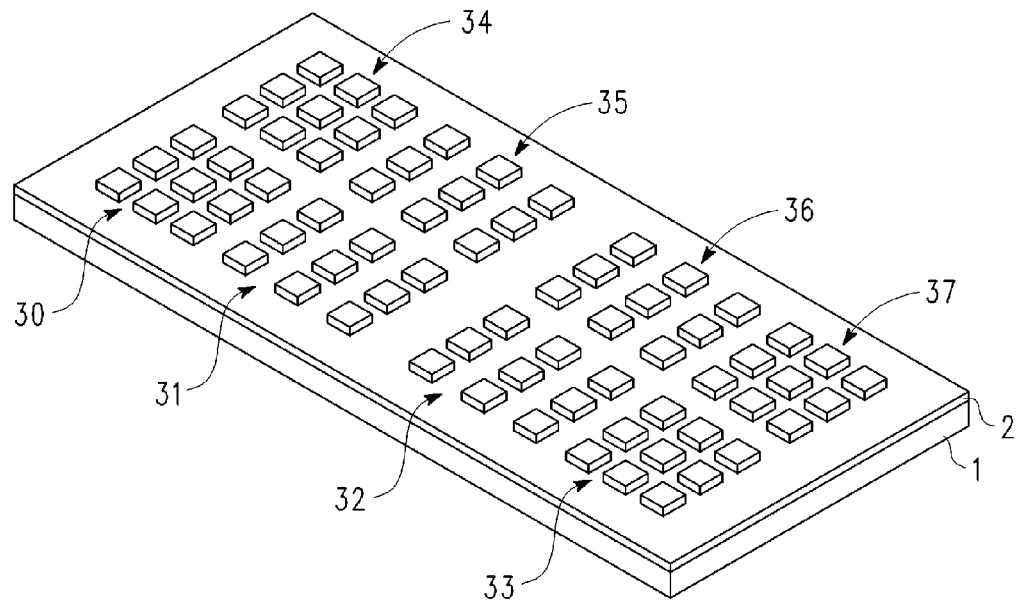
FIG. 1 is a perspective view of a plurality of chip modules which are panel-mounted on a removable attachment device and a process carrier substrate in accordance with selected embodiments.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for using a redistributed chip packaging process to fabricate high density encapsulated semiconductor device or devices with integrated conformal EMI shielding. As a preliminary step, a plurality of circuit devices and an optional embedded grounding frame are assembled as a panel by mounting the circuit devices on a process carrier using a removable attachment device, such as a thick double-sided tape or chemical attachment layer. This assembly occurs prior to forming the underlying circuit substrate. Once the circuit devices are affixed to the removable attachment device, the circuit devices are covered with an insulating layer and a conductive shielding layer by sputtering, dispensing, or spray coating, etc., where the conductive shielding layer may be formed so that it is electrically connected to an embedded grounding frame layer. For example, if an embedded grounding frame is formed on top of the insulating layer, then the conductive shielding layer is formed on top of an in direct physical contact with the embedded grounding frame. However, if the embedded grounding frame is formed below the insulating layer, openings may be formed in the insulating layer to expose the underlying embedded grounding frame that are filled when the conductive shielding layer is formed (e.g., by sputtering, spraying, plating, etc.). Using a laser drill or chemical method, the openings formed in the insulating layer can be formed with at least a single continuous opening or groove that encircles one (or more) individual circuit devices, or can be formed as a plurality of discrete openings of any desired shape (e.g., circular, square, oval, rectangular, etc.) that are positioned to encircle one (or more) individual circuit devices. Once the circuit devices are covered by the conductive shielding layer, the circuit devices are encapsulated with a molding compound or resin. After the removable attachment device is released, a multi-layer circuit substrate with shielding via structures is then built on the bottom of the molding compound by exposing the conductive shielding layer (or embedded grounding frame) and then building up the circuit substrate with its shielding via structures properly aligned and electrically connected to the exposed conductive shielding layer (or embedded grounding frame) at the bottom of the molding compound. In this way, an integrated conformal EMI shield is provided for specific functional circuit block and/or entire module. In selected embodiments, the shielding via ring structure(s) may be connected with a ground ring. After forming the multi-layer circuit substrate with shielding via structures electrically connected to the shielding via ring structures, the panel is cut, sawed, or otherwise separate into singulated dice.

Various illustrative embodiments will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 2:
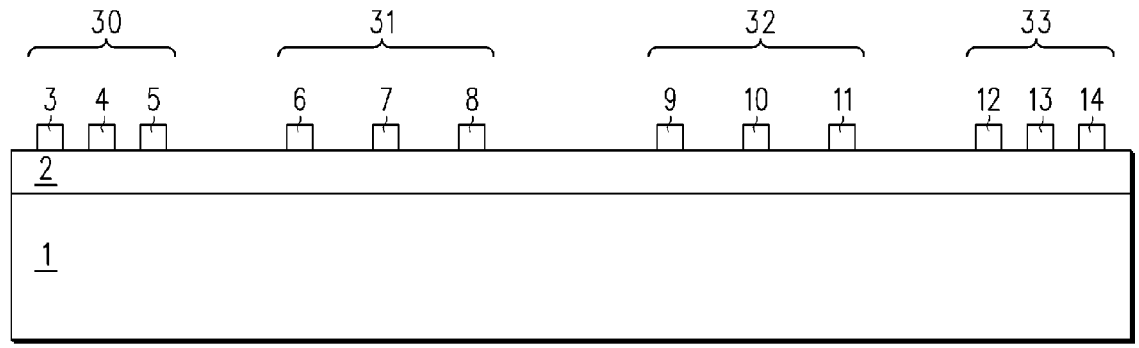
FIG. 2 illustrates a cross-sectional view of the panel-mounted plurality of chip modules depicted in FIG. 1.

Turning now to FIG. 1, a perspective view is illustrated of a plurality of chip modules 30-33 which are mounted as a panel on a removable attachment device 2 (e.g., a double-sided tape or an attachment chemical layer) and a process carrier substrate 1. In addition, FIG. 2 is provided to illustrate a cross-sectional exterior view of the encapsulated plurality of chip modules (panel) depicted in FIG. 1. As illustrated, each chip module (e.g., 30) includes a plurality of microelectronic devices (e.g., 3-5), such as a processor unit, memory unit, related logic units, resistors, capacitors, inductors, and the like. However, it will be appreciated that the advantages of the present invention may also be obtained if each chip module includes only a single microelectronic or circuit device. Each microelectronic device 3-14 in the chip modules 30-33 may be mounted or attached on top of the removable attachment device 2 and process carrier 1 to fix them in place. The purpose of the removable attachment device 2 is to secure the encapsulated chip modules 30-33 during the subsequent fabrication process so that a conformal shielding structure may be integrally formed and encapsulated in the packaging prior forming the underlying multilayer circuit substrate. With this purpose in mind, any desired attachment technique may be used to implement the removable attachment device 2, including but not limited to applying a thick double-sided tape, glue layer or other removable die attach material between the lower surface of the circuit substrate and the process carrier 1.

Figure 3:
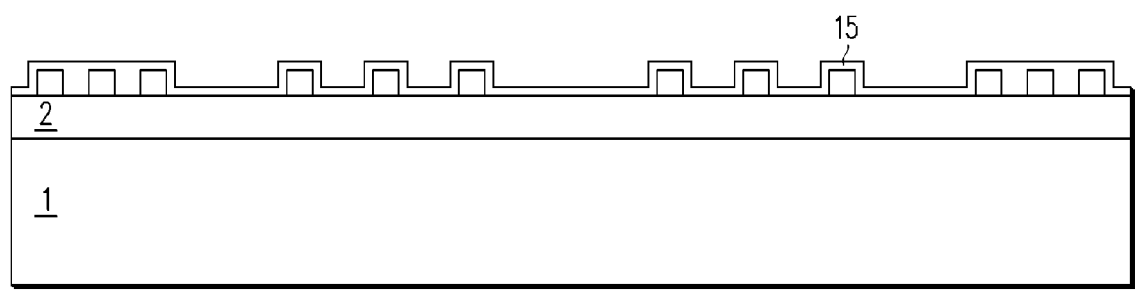
FIG. 3 illustrates processing subsequent to FIG. 2 after an insulating layer is formed over the plurality of chip modules.

After the plurality of chip modules 30-37 are properly attached to the attachment device 2 and carrier 1, a conformal insulative layer or coating 15 is formed (e.g., deposited) over the chip modules 30-33 and other regions of panel assembly which will be shielded to prevent emission or coupling of EMI. As shown in FIG. 3, the insulating layer 15 may be applied directly on the microelectronic devices 3-14 and portions of the substrate to prevent electrical short circuiting to a subsequently deposited conductive layer(s). Thus, coating 15 should be a highly insulative material that is formed to a predetermined thickness of approximately 2-5 um, though other thicknesses can be used. It will be appreciated that the insulator coating 15 may be applied to fill the areas between closely spaced microelectronic devices (e.g., the devices 3-5 in module 30), though the conformal nature of the insulative layer 15 may adhere to the sidewalls of the less closely spaced microelectronic devices (e.g., the devices 6-8 in module 31). The conformal insulative layer 15 also increases the reliability of the finally formed modules by increasing resistance to environmental stresses. In selected embodiments, the conformal insulative layer 15 is formed as a highly insulative polymer having a low modulus of elasticity, such as a silicone gel or elastomer, polyurethane, epoxy, polysiloxane, acrylic, and the like, and may be applied by syringe dispensing, spraying, dip-coating, curtain coating, screen or stencil printing, or by any other appropriate means. In order to avoid coating circuit regions which are to be left uncoated, such as those areas to which contact by the subsequently deposited conductive layer is required, it may be necessary to remove the conformal insulating layer 15 from such regions through photolithographic, laser processing, mechanical ablation, or other appropriate means.

Figure 4:
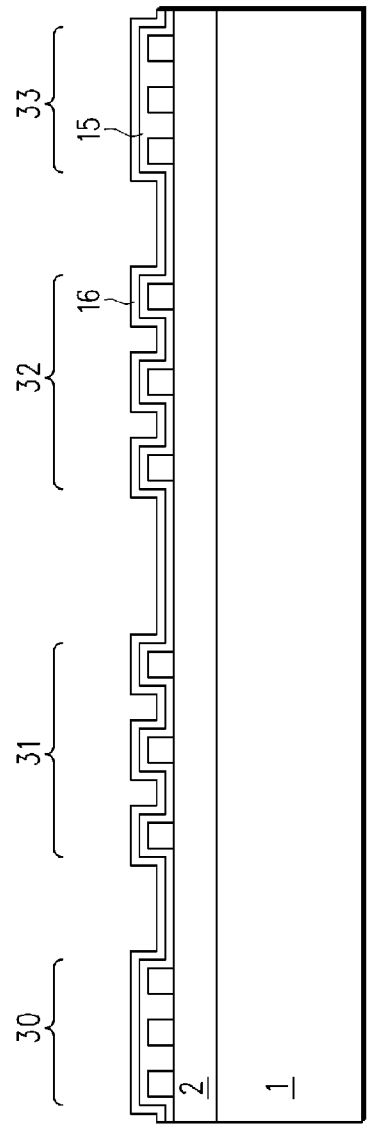
FIG. 4 illustrates processing subsequent to FIG. 3 after a conductive shielding layer is formed over the insulating layer.

FIG. 4 illustrates processing subsequent to FIG. 3 after a conductive shielding layer 16 is formed over the insulating layer 15 to conformally cover the microelectronic devices 3-14 in the chip modules 30-33. The conductive shielding layer 16 can be a polymer, metal, metal alloy (such as a ferromagnetic or ferroelectric material), ink, paint, the like or combinations of the above. In selected embodiments, the conductive shielding layer 16 is formed from aluminum (Al), copper (Cu), nickel iron (NiFe), tin (Sn), zinc (Zn), or the like, including any combination of one or more of the foregoing. For example, by forming the conductive shielding layer 16 as a combination of a non-ferromagnetic material and ferromagnetic material (e.g., a layer of copper and a layer of NiFe), then the circuit modules are protected from electromagnetic fields that are both electric and magnetic with a electromagnetic or broadband shield. Prior to depositing the conductive shielding layer 16, the upper surface of the insulating layer 15 may be prepared so that the conductive shielding layer 16 will adhere. The conductive shielding layer 16 can be deposited by physical vapor deposition (PVD), chemical vapor deposition (CVD), atomic layer deposition (ALD), electrolytic plating, electro-less plating, flame spray, conductive paint spray, vacuum metallization, pad printing, sputtering, evaporation, dispensing, spray coating, or the like, including any combination of one or more of the foregoing. In selected embodiments, the conductive shielding layer 16 is formed to a predetermined thickness of approximately 1-5 um, though other thicknesses can be used, depending on the desired shielding effectiveness. As will be appreciated, it may be necessary to remove the conformal conductive shielding layer 16 from selected regions which are to be left uncoated by shielding layer 16 through photolithographic, laser processing, mechanical ablation, or other appropriate means.

Figure 5:
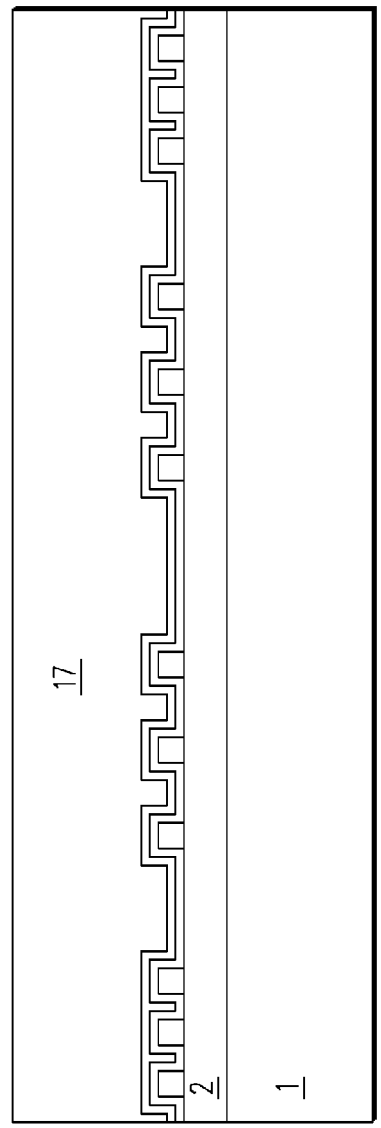
FIG. 5 illustrates processing subsequent to FIG. 4 after a molding compound is formed to encapsulate the panel-mounted plurality of chip modules.

As further illustrated in FIG. 5, the plurality of chip modules 30-37 are encapsulated with an insulating package body or molding 17 which may be formed by applying, injecting or otherwise forming an encapsulant to seal and protect the microelectronic devices in the chip modules from moisture, contamination, corrosion, and mechanical shock. For example, after affixing the microelectronic devices 3-14 to the removable attachment device 2, an encapsulation process is performed to cover the chip modules with a mold compound or mold encapsulant. The mold encapsulant may be a silica-filled resin, a ceramic, a halide-free material, or some other protective encapsulant layer. The mold encapsulant is typically applied using a liquid, which is then heated to form a solid by curing in a UV or ambient atmosphere. The encapsulant can also be a solid that is heated to form a liquid and then cooled to form a solid mold. As will be appreciated, any desired encapsulant process may be used.

Figure 6:
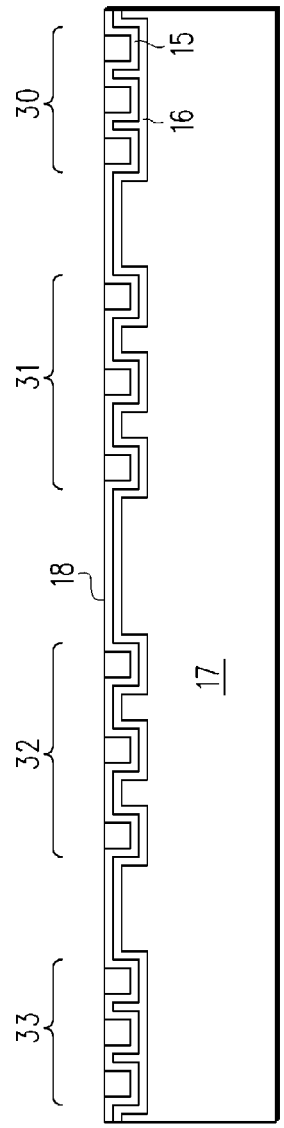
FIG. 6 illustrates processing subsequent to FIG. 5 after the removable attachment device and process carrier are removed and the encapsulated plurality of chip modules is turned over.

At this point, the encapsulated modules may be separated or released as illustrated in FIG. 6 which depicts the processing subsequent to FIG. 5 with a cross-sectional view of the encapsulated plurality of chip modules 30-33 after the removable attachment device 2 and process carrier 1 are removed. As depicted in FIG. 6, the panel of encapsulated modules is turned upside down so that the shielding cover layer 17 is now on the bottom, and the plurality of chip modules 30-33 and insulating layer 15 are exposed on the top surface 18 of the encapsulated panel.

To allow induced currents to be conducted away from the microelectronic devices 3-14 in the completed chips, the conductive shielding layer 16 must be electrically connected to a reference potential, such as ground potential. To this end, a multi-layer circuit substrate structure may be built up over the panel of encapsulated modules, where the circuit substrate structure includes one or more conductive paths that are formed to electrically connect the conductive shielding layer 16 in each module with an external reference potential. For example, the multi-layer circuit substrate structure may be fabricated one layer at a time to include a circuit substrate shielding via structures formed of a conductive/shielding material. By properly positioning the circuit substrate via structures so that they are electrically connected to the conductive shielding layer 16 formed in each packaged module 30-33, individual circuit module(s) may be enclosed and shielded by the shielding via structures. As a result, each individual encapsulated module 30-33 has one or more conductive conformal shielding layers 16 formed in the insulating package body 17 to encircle and shield the circuit module or microelectronic device, and also has one or more circuit substrate via structures formed in the multi-layer circuit substrate that also encircle and shield the circuit module. As described herein, a "via structure" or "via ring structure" refers to a single "through via" and to any combination of conductive paths (e.g., grounding pad structures, embedded grounding frames, micro pads, traces, etc.) that together form a shielding structure.

While any desired fabrication sequence may be used to form the multi-layer circuit substrate, an example sequence is illustrated beginning with FIG. 7 which illustrates processing subsequent to FIG. 6 after a first dielectric layer 19 of a multilayer substrate is formed on the backside 18 of the encapsulated plurality of chip modules 30-33 and patterned openings 20 are formed in the first dielectric layer 19 to expose the conductive shielding layer 16. The first dielectric layer 19 may be formed by applying a patterned adhesive layer of insulating material, by depositing a layer that is then selectively etched, or using any desired technique. Once the first dielectric layer 19 is formed, a selective etch process is applied to form the openings 20 in the first dielectric layer 19 and the underlying conformal insulative layer 15 to thereby expose the conductive shielding layer 16. Though not shown, it will be appreciated that the first dielectric layer 19 may also have openings over the individual circuit module(s) to permit electrical connection to any signal lines or supply voltage lines in the circuit module(s). In this way, each of the microelectronic devices 3-14 in the chip modules may be mounted or attached to the circuit substrate using surface mount techniques, including, but not limited to wire bond, tape-automated bond, solder ball connectors, flip-chip bonding, etc. For example, each microelectronic device may have die bond pads (not shown) which are electrically connected to landing pads (not shown) on the circuit substrate, such as by using wire bonds.

Turning now to FIG. 8, there is illustrated processing subsequent to FIG. 7 with a cross-sectional view of the encapsulated plurality of chip modules 30-33 after micro vias 21 are formed in the patterned openings 20. The individual micro vias 21 may be fabricated by depositing, sputtering or otherwise forming a conductive and/or shielding material in the openings 20, and then polishing or planarizing the upper surface (e.g., with a chemical mechanical polish process) to remove the conductive and/or shielding material, leaving only the conductive micro vias 21 formed on the backside of the encapsulated plurality of chip modules.

Additional layers of the multi-layer circuit substrate may then be formed over the first dielectric layer 19 and micro vias 21 to construct the circuit substrate shielding vias. For example, FIG. 9 illustrates processing subsequent to FIG. 8 with a cross-sectional view of the encapsulated plurality of chip modules 30-33 after micro pads 22 are formed in alignment with the micro vias 21 formed on the backside of the encapsulated plurality of chip modules. The individual micro pads 22 may be fabricated by forming an insulating layer (not shown) with openings over at least the micro vias 21 and then depositing, sputtering or otherwise forming a conductive and/or shielding material in the openings to form the micro pads 22; by applying a patterned adhesive layer of conductive/shielding material; by depositing a conductive/shielding layer that is then selectively etched; or using any desired technique.

Figure 10:
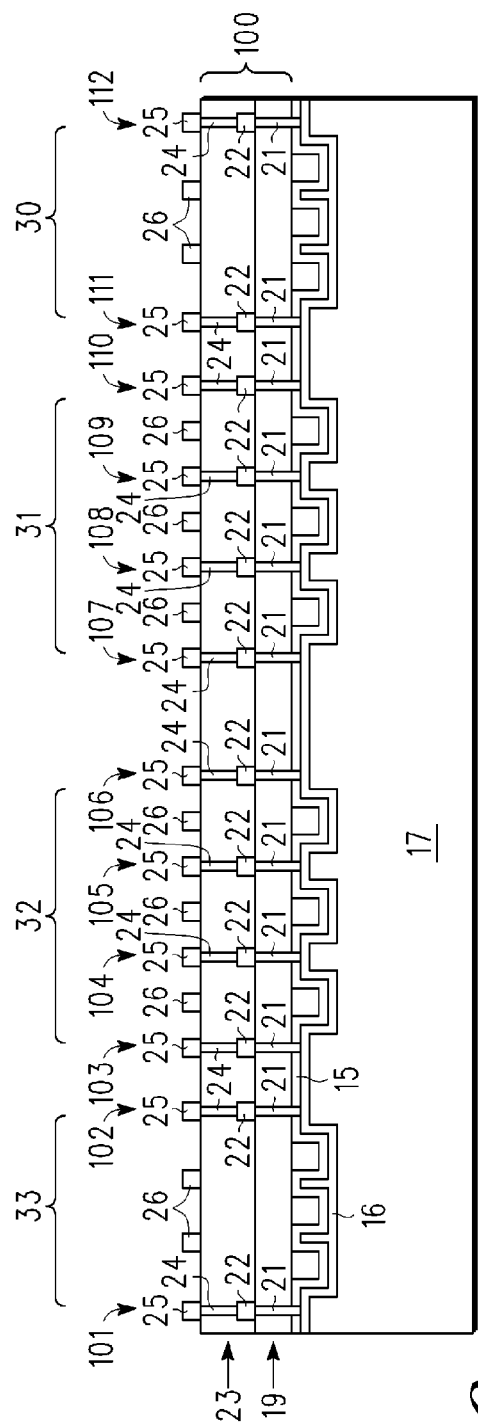
FIG. 10 illustrates processing subsequent to FIG. 9 after a multilayer substrate is formed with grounding via structures which are electrically connected to the conductive shielding layer.

As the multi-layer circuit substrate continues to be built up, circuit substrate shielding via structures 101-112 are formed in electrical connection with the conductive shielding layer 16 in each module. An example process is shown in FIG. 10 which illustrates processing subsequent to FIG. 9 with a cross-sectional view of the encapsulated plurality of chip modules 30-33 after a multilayer substrate 100 is formed by depositing a second dielectric layer 23 and then forming via structures 24 in alignment or in electrical connection with the micro pads 22. Again, the via structures 24 may be fabricated from one or more conductive/shielding layers that are formed over at least the micro pads 22 using any desired technique. However formed, the via structures 24 are electrically connected to the conductive shielding layer 16 formed in the insulating package body 17. The circuit substrate 100 also includes conductive paths (not shown) to electrically couple signals and/or voltages to and from the chip module. Thus, the circuit substrate 100 may be formed to any desired shape and thickness, and may include any desired features for use in forming a functional semiconductor package. In addition, the circuit substrate 100 may be fabricated with any desired material, such as a relatively thin, flexible film of an electrically insulative material (such as an organic polymer resin), or a rigid, substantially planar member fabricated from any known, suitable materials, including, but not limited to, insulator-coated silicon, a glass, a ceramic, an epoxy resin, bismaleimide-triazine (BT) resin, or any other material known in the art to be suitable for use as a circuit substrate.

The finally completed panel may have formed on the circuit substrate one or more I/O pads. As shown in simplified schematic form in FIG. 10, supply voltage and signal I/O pads 26 may be formed so that they can be electrically connected through the multi-layer circuit substrate to the microelectronic devices 3-14 in the chip modules 30-33. In addition, reference voltage pads 25 may be formed so that they can be electrically connected to the via structures 101-112 in the multi-layer circuit substrate 100, and in turn to the conductive shielding layer 16.

Figure 11:
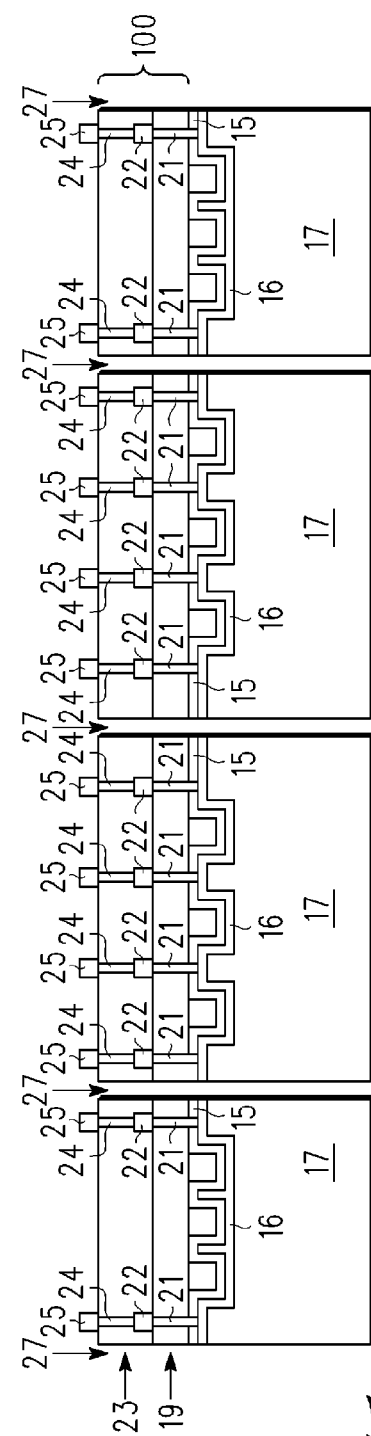
FIG. 11 illustrates processing subsequent to FIG. 10 after individual chip modules are singulated.

Once the multi-layer circuit substrate panel is completed, the panel is cut, sawed, or otherwise separate into singulated dice. This is illustrated in FIG. 11 which depicts processing subsequent to FIG. 10 with a cross-sectional view of the encapsulated plurality of chip modules 30-33 after individual chip modules are singulated by sawing through predetermined cut paths, thereby forming chip modules in which shielding via structures are formed to shield individual circuit devices. As depicted in FIG. 11, cut lines 27 are positioned between individual chip modules (e.g., between circuit substrate shielding via structures 102 and 103 and between circuit substrate shielding via structures 106 and 107) to separate the panel into a first chip module (e.g., chip module 33) and a second chip module (e.g., chip module 32). Depending on how the shielding via structures are positioned and formed in relation to the individual microelectronic devices, the plurality of microelectronic devices (e.g., 3-5) in a given chip module (e.g., module 33) may be collectively shielded by the conductive shielding layer 16 and the shielding via structures (e.g., 101-102). Alternatively, the plurality of microelectronic devices (e.g., 6-8) in a given chip module (e.g., module 32) may be individually shielded by the conductive shielding layer 16 and the shielding via structures (e.g., 103-106) formed in the circuit substrate and insulating package body 17.

Figure 12:
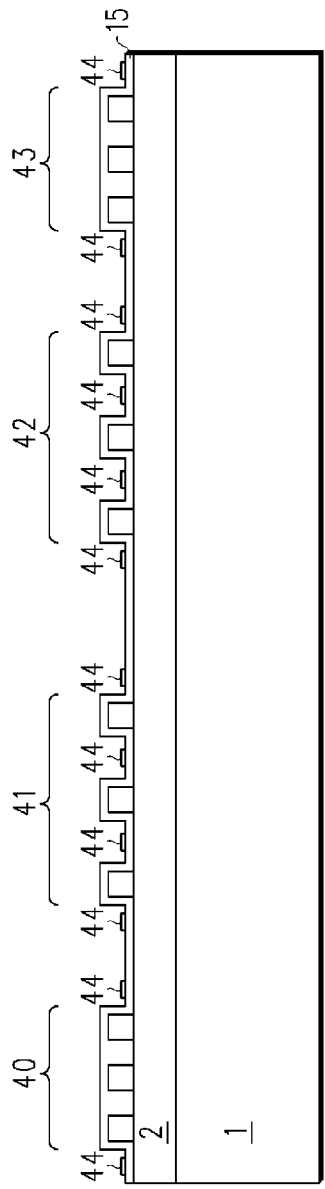
FIG. 12 illustrates a cross-sectional view of a plurality of panel-mounted chip modules on which an insulating layer is formed and an embedded ground plane conductor is placed between individual circuit modules or components in accordance with alternate selected embodiments.

If desired, the conductive shielding layer 16 may be connected to a reference potential through an embedded grounding frame layer that is formed early during the fabrication process to be disposed adjacent to each chip module and/or each microelectronic device. For example, FIG. 12 illustrates a cross-sectional view of the processing subsequent to FIG. 3 after an insulating layer 15 is formed over a plurality of panel-mounted chip modules (now identified with reference numerals 40-43), and an embedded ground plane conductor 44 is placed between individual circuit modules or components in accordance with alternate selected embodiments. The embedded grounding frame layer 44 may be fabricated using any desired technique, such as applying a patterned adhesive layer of conductive/shielding material or depositing a conductive/shielding layer that is then selectively etched. As formed, the grounding frame elements 44 may provide a grounding frame or ring around the microelectronic devices (e.g., 3-5) in a given chip module (e.g., module 40), or around each of the microelectronic devices (e.g., 6-8) in a given chip module (e.g., module 41).

Figure 13:
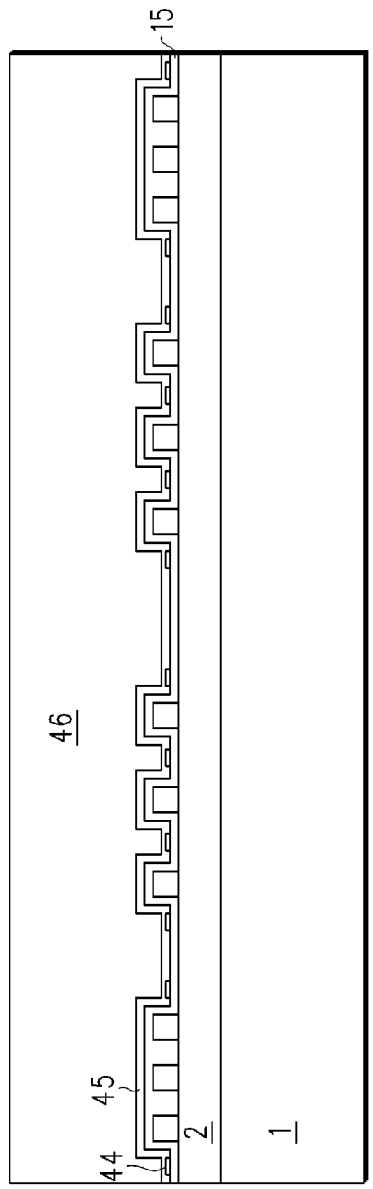
FIG. 13 illustrates processing subsequent to FIG. 12 after a conductive shielding layer is formed over the insulating layer and embedded ground plane conductor and a molding compound is formed to encapsulate the panel-mounted plurality of chip modules.

Next, a conductive shielding layer 45 is deposited over the insulating layer 15 and in contact with embedded grounding frame/conductor/ring 44, and a molding compound 46 is formed to encapsulate the panel-mounted plurality of chip modules 40-43, as illustrated in FIG. 13. As described hereinabove, the insulting layer 15 and conductive shielding layer 45 can be applied by sputtering, dispensing, or spray coating, etc., while the molding compound 46 may be formed by applying, injecting or otherwise forming an encapsulant to seal and protect the microelectronic devices 3-14 in the chip modules 40-43 from moisture, contamination, corrosion, and mechanical shock.

Figure 14:
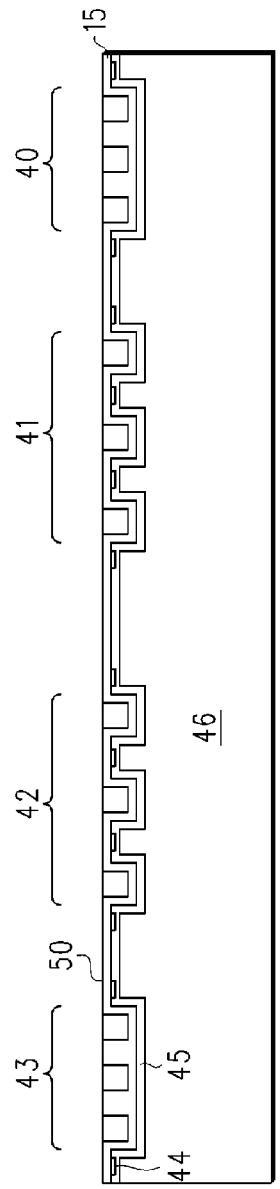
FIG. 14 illustrates processing subsequent to FIG. 13 after the removable attachment device and process carrier are removed and the encapsulated plurality of chip modules is turned over.

After forming and encapsulating the conductive/shielding layer 44 and chip modules 40-43, the encapsulated modules are separated or released from the process carrier 1 and removable attachment device 2, as illustrated in FIG. 14. As depicted in FIG. 14, the panel of encapsulated modules 40-43 is turned upside down so that the shielding cover layer 45 is now on the bottom, and the plurality of chip modules 40-43 and insulating layer 15 are exposed on the top surface 50 of the encapsulated panel. On this surface 50, a multi-layer circuit substrate structure is built up layer by layer to electrically connect the individual microelectronic device 3-14 in the chip modules 40-43 to external signal lines and voltage sources, and to electrically connect the embedded grounding frame layer 44 to an external reference potential, such as ground potential. As formed, the multi-layer circuit substrate includes one or more conductive paths that are formed to electrically connect the embedded grounding frame layer 44 (which is in contact with the conductive shielding layer 45) in each module with an external reference potential.

Figure 15:
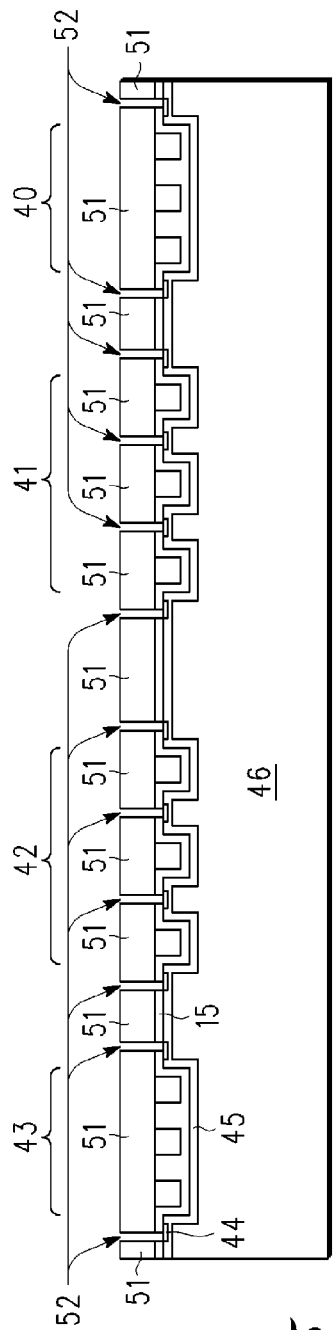
FIG. 15 illustrates processing subsequent to FIG. 14 after a first dielectric layer of a multilayer substrate is formed on the backside of the encapsulated plurality of chip modules and patterned openings are formed in the first dielectric layer to expose the embedded ground plane conductor.

While any desired fabrication sequence may be used to form the multi-layer circuit substrate, an example sequence is illustrated beginning with FIG. 15 which illustrates processing subsequent to FIG. 14 after a first dielectric layer 51 of a multilayer substrate is formed (e.g., deposited) on the backside 50 of the encapsulated plurality of chip modules 40-43. The first dielectric layer 51 may be formed by applying a patterned adhesive layer of insulating material, by depositing a layer that is then selectively etched, or using any desired technique. After forming the first dielectric layer 51, patterned openings 52 are formed in the first dielectric layer 51 to expose the embedded grounding frame layer 44. While any desired etch process may be used, a selective etch process may be applied to form the openings 52 in the first dielectric layer 51 and the underlying conformal insulative layer 15 to thereby expose the embedded grounding frame layer 44. Of course, there may be other openings (not shown) over the individual circuit module(s) to permit electrical connection to any signal lines or supply voltage lines in the circuit module (s) to permit attachment to the circuit substrate using surface mount techniques, including, but not limited to wire bond, tape-automated bond, solder ball connectors, flip-chip bonding, etc.

As the multi-layer circuit substrate continues to be built up, circuit substrate shielding via structures are formed in the substrate to provide shielding by making electrical connection with the embedded grounding frame layer 44 in each module. An example process is shown beginning with FIG. 15 which illustrates processing subsequent to FIG. 14 with a cross-sectional view of the encapsulated plurality of chip modules 40-43 after a multilayer substrate 200 is formed with circuit substrate shielding via structures 201-212. To form the via structures 201-212, a first level of micro via structures 53 are formed in the openings 52 of the first dielectric layer 51 to contact the embedded grounding frame 44 by depositing, sputtering or otherwise forming a conductive and/or shielding material in the openings 52, and then polishing or planarizing the upper surface to clear the top of the first dielectric layer 51. Thereafter, micro pads 54 are formed in alignment with the micro via structures 53 using any desired technique, such as depositing, sputtering or otherwise forming a conductive and/ or shielding material that is selectively etched to form the micro pads 54 or by applying a patterned adhesive layer of conductive/shielding material. Over the micro pads 54, a second dielectric layer 55 is formed, and then via structures 56 are formed from one or more conductive/shielding layers in alignment or in electrical connection with the micro pads 54 using any desired technique. Thus formed, the via structures 56 are electrically connected to the embedded grounding frame 44 and conductive shielding layer 45 formed in the insulating package body 46. Though not shown, the circuit substrate 200 also includes conductive paths to electrically couple signals and/or voltages to and from the chip module. In addition, the finally completed panel may have formed on the circuit substrate one or more I/O pads, including supply voltage and signal I/O pads 58 that are formed to be electrically connected through the multi-layer circuit substrate 200 to the microelectronic devices 3-14 in the chip modules 40-43. In addition, reference voltage pads 57 may be formed so that they can be electrically connected to the via structures 201-212 in the multi-layer circuit substrate 200, and in turn through the embedded grounding frame 44 to the conductive shielding layer 45.

Figure 16:
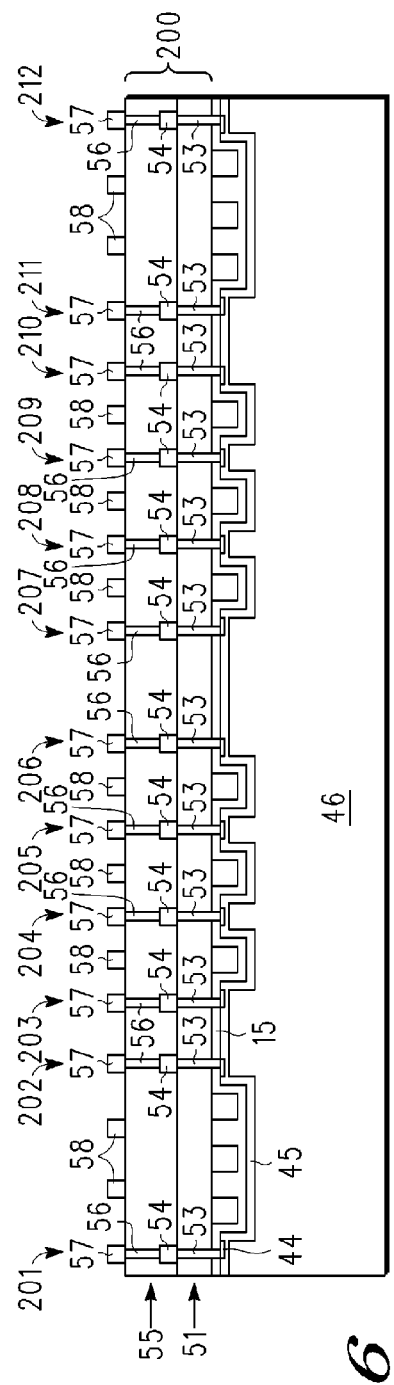
FIG. 16 illustrates processing subsequent to FIG. 15 after a multilayer substrate is formed with grounding via structures which are electrically connected to the embedded ground plane conductor.
Figure 17:
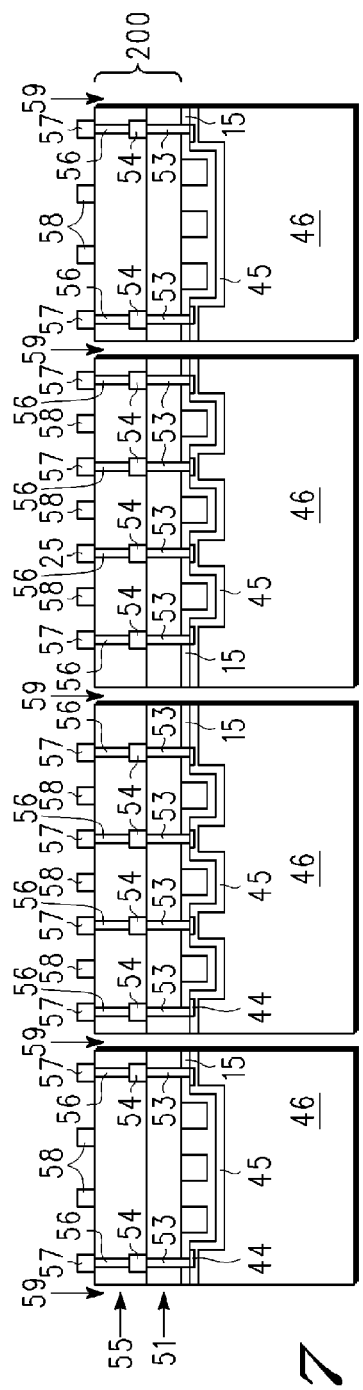
FIG. 17 illustrates processing subsequent to FIG. 16 after individual chip modules are singulated.

Once the multi-layer circuit substrate panel is completed, the panel is cut, sawed, or otherwise separate into singulated dice. This is illustrated in FIG. 17 which depicts processing subsequent to FIG. 16 with a cross-sectional view of the encapsulated plurality of chip modules 40-43 after individual chip modules are singulated by sawing through predetermined cut paths 59, thereby forming chip modules in which shielding via structures are formed to shield individual circuit devices. In particular, the cut lines 59 are positioned between individual chip modules (e.g., between circuit substrate shielding via structures 202 and 203 and between circuit substrate shielding via structures 206 and 207) to separate the panel into a first chip module (e.g., chip module 43) and a second chip module (e.g., chip module 42). Depending on how the shielding via structures are positioned and formed in relation to the individual microelectronic devices, the plurality of microelectronic devices (e.g., 3-5) in a given chip module (e.g., module 43) may be collectively shielded by the embedded grounding frame layer 44, conductive shielding layer 45 and the shielding via structures (e.g., 201-102). Alternatively, the plurality of microelectronic devices (e.g., 6-8) in a given chip module (e.g., module 42) may be individually shielded by the embedded grounding frame layer 44, conductive shielding layer 45 and the shielding via structures (e.g., 203-206) formed in the circuit substrate and insulating package body 46.

Figure 18:
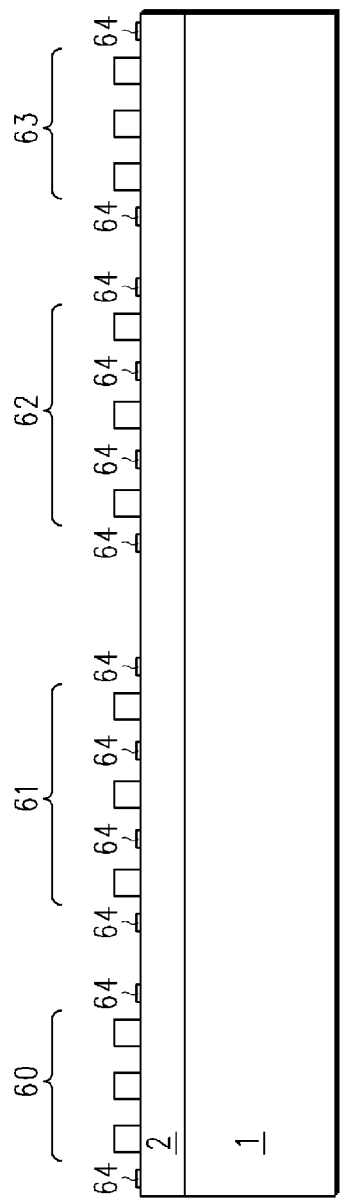
FIG. 18 illustrates a cross-sectional view of a plurality of panel-mounted chip modules after an embedded ground plane conductor is placed between individual circuit modules or components in accordance with alternate selected embodiments.

In yet other embodiments, each chip module may have an embedded grounding frame that is applied directly to the removable attachment device 2 so as to be disposed adjacent to the chip modules 60-63. This is illustrated in FIG. 18, which depicts each microelectronic device in the chip modules 60-63 as being mounted or attached on top of the removable attachment device 2 and process carrier 1 to fix them in place. The embedded grounding frame layer 64 may be fabricated using any desired technique, such as applying a patterned adhesive layer of conductive/shielding material or depositing a conductive/shielding layer that is then selectively etched. At this point in the fabrication process, the grounding frame elements 64 are also attached to the removable attachment device 2 to form a grounding frame or ring 64 around a first chip module 60, or to form a grounding frame or ring 64 around individual microelectronic devices (e.g., the devices 6-8 in module 61).

Figure 19:
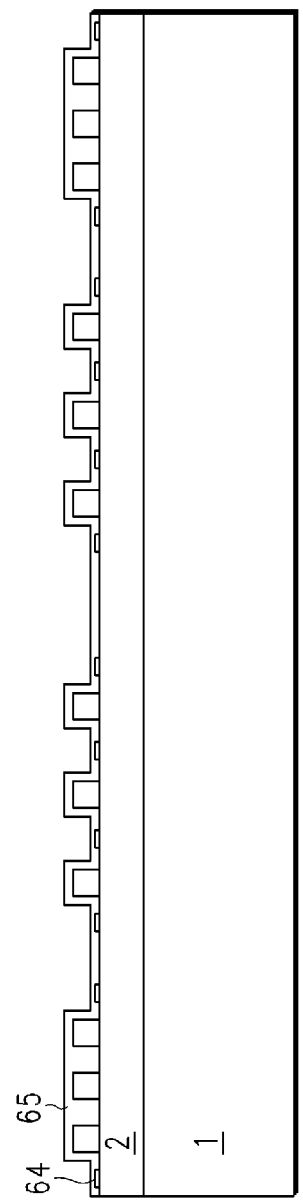
FIG. 19 illustrates processing subsequent to FIG. 18 after an insulating layer is formed over the plurality of chip modules.
Figure 20:
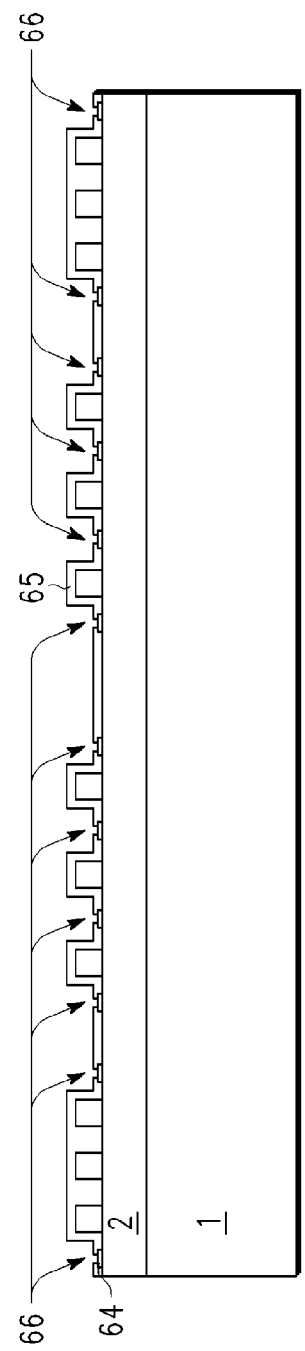
FIG. 20 illustrates processing subsequent to FIG. 19 after patterned openings are formed in the insulating layer to expose the embedded ground plane conductor.

After the plurality of microelectronic devices (e.g., 3-14) and embedded grounding frame elements 64 are attached to the removable attachment device 2, a conformal insulating layer or coating 65 is applied over the plurality of chip modules 60-63. For example, FIG. 19 illustrates processing subsequent to FIG. 18 after an insulating layer 65 is applied directly on the microelectronic devices 3-14 and the embedded grounding frame elements 64 to prevent electrical short circuiting to a subsequently deposited conductive layer(s). However, to avoid coating the embedded grounding frame elements 64 which are to make electrical contact with the subsequently deposited conductive layer, it may be necessary to remove the insulating layer 65 from such regions through photolithographic, laser processing, mechanical ablation, or other appropriate means. For example, the insulating layer 65 may be processed to expose the embedded grounding frame elements 64 by forming openings 66 between individual chip modules 60-63 and/or between the individual microelectronic devices (e.g., 6-11). This is depicted in FIG. 20 which illustrates processing subsequent to FIG. 19 with a cross-sectional view of the encapsulated plurality of chip modules 60-63 after openings 66 are formed in the insulating layer 65 using laser drill or selective chemical etch processes to expose the embedded ground frame 64.

Figure 21:
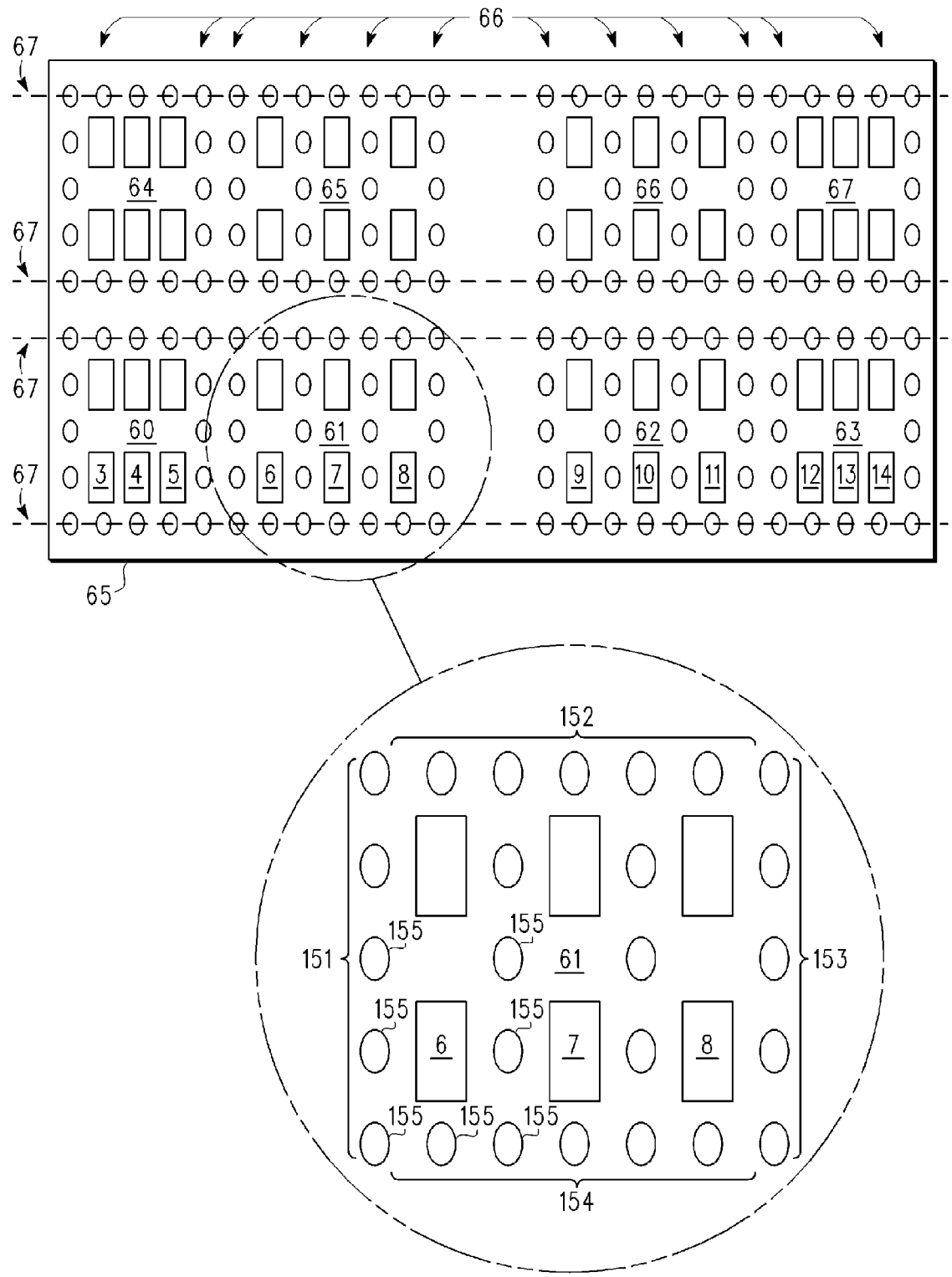
FIG. 21 illustrates an example plan view of an plurality of chip modules depicted in FIG. 20 to show how the patterned openings in the insulating layer may be formed as a plurality of discrete openings of any desired shape.

In selected embodiments, photolithography techniques may be applied to selective etch grooved openings 66 in the insulating layer 65, thereby forming one or more via openings that are positioned to encircle one (or more) individual chip modules or individual microelectronic devices. However, instead of using continuous groove openings 66, the via openings can be formed as a plurality of discrete openings that are positioned to collectively encircle one (or more) individual chip modules. An example implementation is depicted in FIG. 21, which illustrates an example plan view of an encapsulated plurality of chip modules 60-67 to show how vertical rows of via openings 66 and horizontal rows of via openings 67 may be formed in the insulating layer 65 as a plurality of discrete openings of any desired shape (e.g., circular, square, oval, rectangular, etc.). Thus, a plurality of separate via openings may be laser drilled to surround the individual chip modules (e.g., 60, 63, 64, 67) and/or between the individual microelectronic devices (e.g., 6-11), including via openings 151, 152, 153 and 154. By positioning a plurality of discrete openings to encircle one (or more) individual chip modules or individual microelectronic devices, shielding via ring structures can subsequently be formed by filling the via openings with conductive/shielding material to shield the one (or more) individual circuit modules/devices from electromagnetic interference.

As seen from the foregoing, the via openings 66 can be formed as either continuous or discrete openings having any desired shape, provided that the via openings encircle the chip module(s) or device(s) that are to be shielded. In addition, the placement of the via openings (and the subsequently formed shielding via ring structures) may be controlled to provide local shielding for individual modules or devices, as well as global shielding from external EMI sources. As an example of local shielding, the shielding via ring structures formed in the openings 155 shield the microelectronic device 6 from microelectronic device 7 in the same module 31. As an example of global shielding, the shielding via ring structures formed in the openings 151-154 help shield the module 61 from externally-located modules. Those skilled in the art will appreciate that the shape, size and spacing of separate via openings may be controlled so as to achieve the EMI shielding benefits of the present invention, even when a single continuous groove opening is not used, because separate shielding via structures will effectively act as a single shielding structure when positioned sufficiently close to one another.

Once the openings 66 are formed, a conductive shielding layer 68 can be deposited over the insulating layer 65 and in contact with embedded grounding frame/conductor/ring 64 through the openings 66, and a molding compound 69 may be formed to encapsulate the panel-mounted plurality of chip modules 60-63, as illustrated in FIG. 22. As described hereinabove, the conductive shielding layer 68 can be applied by sputtering, dispensing, or spray coating, etc., while the molding compound 69 may be formed by applying, injecting or otherwise forming an encapsulant to seal and protect the microelectronic devices 3-14 in the chip modules 60-63 from moisture, contamination, corrosion, and mechanical shock.

After forming and encapsulating the conductive/shielding layer 68 and chip modules 60-63, the encapsulated modules are separated or released from the process carrier 1 and removable attachment device 2, as illustrated in FIG. 23. Once the panel of encapsulated modules 60-63 is turned over, the shielding cover layer 68 is on the bottom, and the plurality of chip modules 60-63, embedded grounding frame 64 and insulating layer 65 are exposed on the top surface 70 of the encapsulated panel. On this surface 70, a multi-layer circuit substrate structure 300 may be built up layer by layer to electrically connect the individual microelectronic device 3-14 in the chip modules 60-63 to external signal lines and voltage sources. As formed, the multi-layer circuit substrate 300 includes circuit substrate shielding via structures 301-312 formed with one or more conductive paths that electrically connect the embedded grounding frame layer 64 (which is in contact with the conductive shielding layer 68) in each module with an external reference potential. To form the circuit substrate shielding via structures 301-312, FIG. 24 illustrates a multi-layer circuit substrate 300 which includes a first dielectric layer 71 formed on the backside 70 of the encapsulated plurality of chip modules 60-63, a first level of micro via structures 72 formed in openings in the first dielectric layer 71 which expose the embedded grounding frame 64, a plurality of micro pads 73 formed in alignment or electrical contact with the micro via structures 72, a second dielectric layer 74 formed over the micro pads 73, and a plurality of via structures 75 formed in alignment or in electrical connection with the micro pads 73. In addition, the finally completed panel may have formed on the circuit substrate one or more I/O pads, including supply voltage and signal I/O pads 77 (that are electrically connected through the multi-layer circuit substrate 300 to the microelectronic devices 3-14 in the chip modules 60-63) and reference voltage pads 76 formed so that they can be electrically connected to the via structures 301-312 in the multi-layer circuit substrate 300, and in turn through the embedded grounding frame 64 to the conductive shielding layer 68. Though not shown, the circuit substrate 300 also includes conductive paths to electrically couple signals and/or voltages to and from the chip module.

Figure 25:
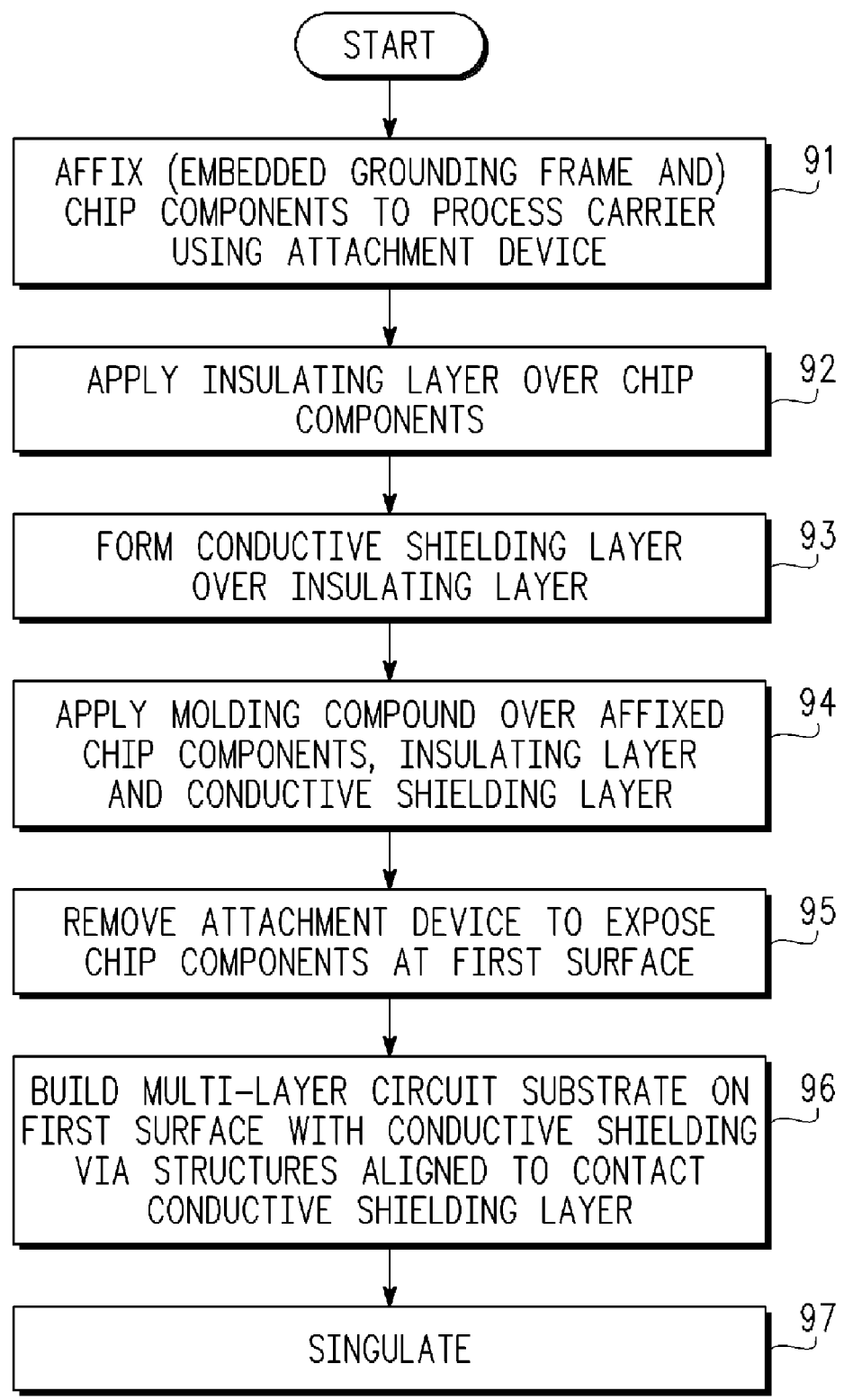
FIG. 25 illustrates a sample fabrication sequence flow for fabricating chip modules with integrated conformal shielding.

Turning now to FIG. 25, there is illustrated a sample fabrication sequence flow for fabricating chip modules with an integrated conformal EMI shielding. As an initial step 91, a plurality of chip modules/components are mounted or affixed on the surface of a process carrier using a releasable attachment device, such as a double sided tape layer or glue layer. At this point, an embedded grounding frame may also be affixed to the releasable attachment device to surround the plurality of chip modules/components (as indicated parenthetically), though the embedded grounding frame may instead be applied later in the fabrication sequence. With the chip modules/components assembled on the attachment device, an insulating layer is applied to cover the chip modules/components (step 92), and a conductive shielding layer is formed over the insulating layer (step 93). As formed, the insulating layer prevents electrical short circuiting to the subsequently deposited conductive shielding layer, but allows electrical contact between the conductive shielding layer and any underlying embedded grounding frame. Thereafter, a molding compound is formed to encapsulate the chip modules/components (step 94). Once the conductive shielding layer and chip modules/components are encapsulated, the removable attachment device is released to expose the chip modules/components at a first surface (step 95). On the first surface, there are also exposed conductive elements (e.g., embedded grounding frame elements or openings through the insulating layer which expose the conductive shielding layer) which are electrically connected to the conductive shielding layer. A multi-layer circuit substrate is then built on the first surface of the encapsulated chip modules/components (96). The multi-layer circuit substrate is formed to include conductive shielding via structures that are aligned with and electrically coupled to the conductive shielding layer formed in the molding compound, so that individual circuit devices or components are surrounded and shielded by the shielding via structures. Finally, the individual chip modules are cleaned and separated from one another (step 97).

By now it should be appreciated that there is provided herein a method for making a package assembly with integrated conformal EMI shielding. As disclosed, a plurality of microelectronic devices (such as circuit devices, grounding frames, etc.) are attached to a releasable attachment device (such as a double-sided tape or glue layer). Thereafter, an insulating layer is formed over the a plurality of microelectronic devices, and then a conductive layer is formed over the insulating layer to form a shielding structure over each of the plurality of microelectronic devices that is insulated therefrom by the insulating layer. The conductive layer may be formed by depositing a conductive layer by PVD, CVD, ALD, electrolytic plating, electroless plating, flame spray, conductive paint spray, vacuum metallization, pad printing, sputtering, evaporation, dispensing or spray coating. In selected embodiments, an embedded grounding frame formed from one or more grounding elements may be attached to the releasable attachment device prior to forming the insulating layer so as to surround each of the microelectronic devices, in which case openings are selectively etched in the insulating layer to expose the one or more grounding elements surrounding each of the plurality of microelectronic devices prior to forming a conductive layer over the insulating layer so that the conductive layer makes electrical contact with the embedded grounding frame. In other embodiments, an embedded grounding frame is applied on the insulating layer prior to forming the conductive layer, where the grounding frame comprises one or more grounding elements that are positioned to surround each of the plurality of microelectronic devices and to electrically connect the shielding structure for each microelectronic device to a corresponding circuit substrate shielding via structure in the multi-layer circuit substrate. An encapsulation package is then formed over the conductive layer to encapsulate the plurality of microelectronic devices, where a first surface of the encapsulation package contacts the releasable attachment device. After removing the removable attachment device from the first surface of the encapsulation package, the plurality of microelectronic devices are exposed at the first surface of the encapsulation package, and a circuit substrate is then formed on that surface. The circuit substrate may be formed as a multi-layer circuit substrate in which are formed a plurality of circuit substrate shielding via structures, each of which is in electrical contact with a corresponding shielding structure over a microelectronic device so that each circuit substrate shielding via structure surrounds at least part of an area below a corresponding microelectronic device. In various embodiments, the circuit substrate shielding via structures may be formed in the circuit substrate from one or more conductive layers, such as a micro via layer, a micro pad layer, a grounding pad, an embedded grounding frame, and/or a trace layer that is electrically connected to the shielding structure. Once the circuit substrate is completed, each of the microelectronic devices can be singulated along with its corresponding shielding structure and circuit substrate shielding via structure by cutting through the encapsulation package and the multi-layer circuit substrate along cut lines that separate the plurality of microelectronic devices.

In another form, there is provided a method of forming a plurality of packaged circuit modules. As disclosed, the packaged circuit modules are formed by providing a package panel in which circuit devices are each conformally covered by an insulating layer and a conductive shielding layer before forming an encapsulation package so as to expose the plurality of circuit devices at a bottom surface of the encapsulation package. In an example embodiment, the package panel is provided by providing a process carrier that is releasably attached to the plurality of circuit devices (and optionally, a ground frame) with a double-sided tape layer or glue layer, forming an insulating layer over the circuit devices, forming the conductive shielding layer over the insulating layer, and then encapsulating the plurality of circuit devices (and ground frame and conductive shielding layer) with a mold encapsulant to form an encapsulation package. Prior to forming the conductive shielding layer, a conductive grounding frame may be formed on the insulating layer which includes grounding elements that are positioned to electrically connect the conductive shielding layer through one or more openings formed in the insulating layer to expose conductive grounding frame to a corresponding conductive shielding via structure in the circuit substrate. Alternatively, the conductive grounding frame may be releasably attached to the process carrier prior to forming the insulating layer so as to surround each of the plurality of circuit devices so that the conductive grounding frame is exposed at a bottom surface of the encapsulation package and positioned in alignment with the conductive shielding via structures, in which case openings in the insulating layer are selectively etched to expose the conductive grounding frame prior to forming the conductive shielding layer so that the conductive shielding layer makes electrical contact with the conductive grounding frame. On the bottom surface of the encapsulation package, a circuit substrate is formed having conductive shielding via structures that are each in electrical contact with the conductive shielding layer so that each conductive shielding via structure surrounds at least part of an area below a corresponding circuit device. For example, a multi-layer circuit substrate may be formed in which each of the plurality of conductive shielding via structures is substantially aligned with and electrically connected to the conductive shielding layer formed in the encapsulation package so as to surround and shield each of the plurality of circuit devices. In various embodiments, the conductive shielding via structure is formed with one or more conductive layers formed in the multi-layer circuit substrate, such as a micro via layer, a micro pad layer, a grounding pad, an embedded grounding frame, or a trace layer that is electrically connected to the conductive shielding layer. Subsequently, the package panel may be singulated into separate packaged circuit modules, such as by sawing or cutting, so that each module includes one or more circuit devices covered by part of the conductive shielding layer and one or more conductive shielding via structures.

In yet another form, there is provided a high density RF module package having an encapsulant package formed to encapsulate one or more microelectronic circuits so as to expose the one or more microelectronic circuits at a bottom surface of the encapsulant package. As formed, the one or more microelectronic circuits in the encapsulant package are covered with a conformal conductive shield coating that is formed internally to the encapsulant package to shield the one or more microelectronic circuits against electromagnetic interference. The package also includes a circuit substrate which is formed on the bottom surface of the encapsulant package. The circuit substrate may be formed as a multi-layer circuit substrate having a shielding via structure that is electrically connected to the conformal conductive shield coating formed in the encapsulant package so that that the shielding via structure surrounds at least part of an area below the one or more microelectronic devices. The encapsulant package may be formed to include an embedded ground frame which is exposed at the bottom surface of the encapsulant package and positioned in alignment with the shielding via structure. The shielding via structure may be formed with one or more conductive layers in the circuit substrate, such as a micro via layer, a micro pad layer, a grounding pad, an embedded grounding frame, or a trace layer that is electrically connected to the conformal conductive shield coating.

Although the described exemplary embodiments disclosed herein are directed to various packaging assemblies and methods for making same, the present invention is not necessarily limited to the example embodiments which illustrate inventive aspects of the present invention that are applicable to a wide variety of packaging processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making a package assembly with integrated conformal EMI shielding, comprising:
   attaching a plurality of microelectronic devices to a releasable attachment device;
   forming an insulating layer over the a plurality of microelectronic devices;
   applying an embedded grounding frame on the insulating layer comprising one or more grounding elements that are positioned to surround each of the plurality of microelectronic devices;
   forming a conductive layer over the insulating layer, thereby forming a shielding structure over each of the plurality of microelectronic devices that is insulated from the plurality of microelectronic devices by the insulating layer and that is electrically connected to the embedded grounding frame;
   forming an encapsulation package over the conductive layer to encapsulate the plurality of microelectronic devices, the encapsulation package comprising a first surface that contacts the releasable attachment device;
   removing the removable attachment device from the first surface of the encapsulation package to thereby expose the plurality of microelectronic devices at the first surface of the encapsulation package; and
   forming a multi-layer circuit substrate on the first surface of the encapsulation package comprising a plurality of circuit substrate shielding via structures, each of which is in electrical contact with the embedded grounding frame and a corresponding shielding structure over a microelectronic device.

2. The method of claim 1, where attaching the plurality of microelectronic devices to a releasable attachment device comprises applying a double-sided tape layer to attach the plurality of microelectronic devices to a process carrier.

3. The method of claim 1, where attaching the plurality of microelectronic devices to a releasable attachment device comprises applying a glue layer to attach the plurality of microelectronic devices to a process carrier.

4. The method of claim 1, where applying the embedded grounding frame comprises:
   attaching an embedded grounding frame to the releasable attachment device prior to forming the insulating layer, where the grounding frame comprises one or more grounding elements surrounding each of the plurality of microelectronic devices; and
   selectively etching a plurality of openings in the insulating layer to expose the one or more grounding elements surrounding each of the plurality of microelectronic devices prior to forming a conductive layer over the insulating layer so that the conductive layer makes electrical contact with the embedded grounding frame.

5. The method of claim 1, where forming a conductive layer over the insulating layer comprises depositing a conductive layer by physical vapor deposition, chemical vapor deposition, atomic layer deposition, electrolytic plating, electroless plating, flame spray, conductive paint spray, vacuum metallization, pad printing, sputtering, evaporation, dispensing or spray coating.

6. The method of claim 1, where each of the circuit substrate shielding via structures comprises a conductive layer, such as a micro via layer, a micro pad layer, a grounding pad, an embedded grounding frame, or a trace layer that is electrically connected to the shielding structure.

7. The method of claim 1, further comprising singulating each of the plurality of microelectronic devices along with its corresponding shielding structure and circuit substrate shielding via structure by cutting through the encapsulation package and the multi-layer circuit substrate along cut lines that separate the plurality of microelectronic devices.

8. A method of forming packaged circuit modules comprising:
   providing a package panel comprising a plurality of circuit devices that are each conformally covered by an insulating layer on which is formed a conductive grounding frame comprising one or more grounding elements and a conductive shielding layer electrically connected to the conductive grounding frame before forming an encapsulation package so as to expose the plurality of circuit devices at a bottom surface of the encapsulation package;

forming a circuit substrate on the bottom surface of the encapsulation package comprising a plurality of conductive shielding via structures, each of which is in electrical contact with the conductive grounding frame and conductive shielding layer formed over the plurality of circuit devices; and singulating the package panel into separate packaged circuit modules, each of which comprises one or more circuit devices covered by part of the conductive shielding layer and one or more conductive shielding via structures.

9. The method of claim 8, where providing a package panel comprises:

providing a process carrier;

releasably attaching the plurality of circuit devices to the process carrier with a double-sided tape layer or glue layer; and forming the insulating layer over the plurality of circuit devices;

forming a conductive grounding frame on the insulating layer prior to forming the conductive shielding layer, where the conductive grounding frame comprises one or more grounding elements that are positioned to electrically connect the conductive shielding layer through one or more openings formed in the insulating layer to a corresponding conductive shielding via structure in the circuit substrate;

forming the conductive shielding layer over the insulating layer and in electrical contact with the conductive grounding frame; and encapsulating the plurality of circuit devices with a mold encapsulant to form the encapsulation package.

10. The method of claim 9, further comprising selectively etching a plurality of openings in the insulating layer after forming the encapsulation package and prior to forming the circuit substrate, thereby exposing the conductive grounding frame surrounding each of the plurality of circuit devices.

11. The method of claim 9, where forming the conductive grounding frame comprises releasably attaching a conductive grounding frame to the process carrier to surround each of the plurality of circuit devices so that the conductive grounding frame is exposed at a bottom surface of the encapsulation package and positioned in alignment with the conductive shielding via structures.

12. The method of claim 11, further comprising selectively etching a plurality of openings in the insulating layer to expose the conductive grounding frame surrounding each of the plurality of circuit devices prior to forming the conductive shielding layer over the insulating layer so that the conductive shielding layer makes electrical contact with the conductive grounding frame.

13. The method of claim 8, where forming a circuit substrate comprises forming a multi-layer circuit substrate in which each of the plurality of conductive shielding via structures is substantially aligned with and electrically connected to the conductive shielding layer formed in the encapsulation package so as to surround and shield each of the plurality of circuit devices.

14. The method of claim 13, where forming the multi-layer circuit substrate comprises forming conductive shielding via structures with one or more conductive layers in the multi-layer circuit substrate, such as a micro via layer, a micro pad layer, a grounding pad, an embedded grounding frame, or a trace layer that is electrically connected to the conductive shielding layer.

15. A high density RF module package comprising:

an encapsulant package formed to encapsulate one or more microelectronic circuits so as to expose the one or more microelectronic circuits at a bottom surface of the encapsulant package, where the one or more microelectronic circuits are covered with a conformal conductive shield coating formed internally to the encapsulant package to shield the one or more microelectronic circuits against electromagnetic interference; and a circuit substrate formed on the bottom surface of the encapsulant package, where the encapsulant package comprises an embedded ground frame which is exposed at the bottom surface of the encapsulant package and positioned in alignment with the shielding via structure.

16. The high density RF module package of claim 15, where the circuit substrate comprises a multi-layer circuit substrate comprising a shielding via structure that is electrically connected to the conformal conductive shield coating formed in the encapsulant package so that that the shielding via structure surrounds at least part of an area below the one or more microelectronic devices.

17. The high density RF module package of claim 16, where the circuit substrate comprises a shielding via structure formed with one or more conductive layers in the circuit substrate, such as a micro via layer, a micro pad layer, a grounding pad, an embedded grounding frame, or a trace layer that is electrically connected to the conformal conductive shield coating.

* * * * *

UNITED STATES PATENT AND TRADEMARK OFFICE
CERTIFICATE OF CORRECTION

| | | |
|---|---|---|
| PATENT NO. | : 7,981,730 B2 | Page 1 of 1 |
| APPLICATION NO. | : 12/169964 | |
| DATED | : July 19, 2011 | |
| INVENTOR(S) | : Jibang Tang et al. | |

It is certified that error appears in the above-identified patent and that said Letters Patent is hereby corrected as shown below:

IN THE CLAIMS:

Column 15, Claim 1, line 66:

"over the a plurality" should be "over the plurality"

Signed and Sealed this
Seventh Day of August, 2012

David J. Kappos
*Director of the United States Patent and Trademark Office*